(12) United States Patent
Kubo

(10) Patent No.: US 10,819,356 B2
(45) Date of Patent: Oct. 27, 2020

(54) PLL FREQUENCY SYNTHESIZER

(71) Applicant: THINE ELECTRONICS, INC., Tokyo (JP)

(72) Inventor: Shunichi Kubo, Tokyo (JP)

(73) Assignee: THINE ELECTRONICS, INC., Chiyoda-ku, Tokyo (JP)

( * ) Notice: Subject to any disclaimer, the term of this patent is extended or adjusted under 35 U.S.C. 154(b) by 0 days.

(21) Appl. No.: 16/611,955

(22) PCT Filed: May 24, 2017

(86) PCT No.: PCT/JP2017/019407
§ 371 (c)(1),
(2) Date: Nov. 8, 2019

(87) PCT Pub. No.: WO2018/216148
PCT Pub. Date: Nov. 29, 2018

(65) Prior Publication Data
US 2020/0099383 A1 Mar. 26, 2020

(51) Int. Cl.
*H03L 7/10* (2006.01)
*H03L 7/089* (2006.01)
(Continued)

(52) U.S. Cl.
CPC .............. *H03L 7/10* (2013.01); *H03L 7/0898* (2013.01); *H03L 7/093* (2013.01); *H03L 7/099* (2013.01); *H03L 7/18* (2013.01)

(58) Field of Classification Search
CPC ......... H03L 7/10; H03L 7/0898; H03L 7/093; H03L 7/099; H03L 7/18
(Continued)

(56) References Cited

U.S. PATENT DOCUMENTS 6,891,414 B1 * 5/2005 Bunch ................... H03L 7/0891
327/147
7,772,930 B2  8/2010 Gatta
(Continued)

FOREIGN PATENT DOCUMENTS

JP   05259902 A   10/1993
JP   09307437 A   11/1997
(Continued)

OTHER PUBLICATIONS

International Search Report of PCT/JP2017/019407 dated Aug. 15, 2017.
(Continued)

*Primary Examiner* — Tomi Skibinski
(74) *Attorney, Agent, or Firm* — Sughrue Mion, PLLC

(57) ABSTRACT

A PLL frequency synthesizer includes a voltage controlled oscillator that outputs an oscillation signal having a frequency corresponding to a control voltage value, a phase comparison unit that outputs a phase difference signal representing a phase difference between a feedback oscillation signal and a reference oscillation signal, a charge pump that outputs a charge and discharge current according to the phase difference, a loop filter that outputs the control voltage value, which is increased or decreased according to a charge and discharge amount of a capacitive element, to the voltage controlled oscillator, a detection unit that detects a change rate of the control voltage value, and a control unit that adjusts the charge and discharge current, a characteristic of the loop filter, or a characteristic of the voltage controlled oscillator based on a detection result of the detection unit.

10 Claims, 18 Drawing Sheets

(51) Int. Cl.
*H03L 7/093* (2006.01)
*H03L 7/099* (2006.01)
*H03L 7/18* (2006.01)

(58) Field of Classification Search
USPC ....... 327/147–163; 331/16, 17; 375/373–376
See application file for complete search history.

(56) References Cited

U.S. PATENT DOCUMENTS

| | | | |
|---|---|---|---|
| 8,483,985 B2 | 7/2013 | Stockstad et al. | |
| 2003/0231068 A1* | 12/2003 | Humphreys | H03L 7/0898 331/17 |
| 2008/0164918 A1* | 7/2008 | Stockstad | H03L 7/0898 327/157 |

FOREIGN PATENT DOCUMENTS

| | | |
|---|---|---|
| JP | 11274920 A | 10/1999 |
| JP | 2003198364 A | 7/2003 |
| JP | 2004-241933 A | 8/2004 |
| JP | 2005094282 A | 4/2005 |
| JP | 2005-312028 A | 11/2005 |
| JP | 2006-33108 A | 2/2006 |
| JP | 2006180428 A | 7/2006 |
| JP | 2009543463 A | 12/2009 |
| JP | 2013-016995 A | 1/2013 |
| JP | 2016-178351 A | 10/2016 |
| WO | 2008005677 A1 | 1/2008 |

OTHER PUBLICATIONS

International Preliminary Report and Translation of the Written Opinion dated Dec. 5, 2019 from the International Bureau in application No. PCT/JP2017/019407.

* cited by examiner

Fig. 10

OUTPUT SETTING FOR EACH SCPCC

| SCPCC | 00(WAIT) | 01(CAL) | 11(FIN) | 10(TMP) |
|---|---|---|---|---|
| VCFIXp | H | L | L | L |
| PFDENp | L | H | L | L |

*Fig.12*

OUTPUT SETTING FOR EACH CPCNT

| SCPCCNT | 0~14 | 15 |
|---|---|---|
| FCNT | 0 | H |

Fig. 15

OUTPUT SETTING FOR EACH SCG State

| SCPCCNT | INIT | UP/DN | DNE |
|---|---|---|---|
| CALAGAIN | H | H | L |
| CALDNE | L | L | H |

PLL FREQUENCY SYNTHESIZER

CROSS REFERENCE TO RELATED APPLICATIONS

This application is a National Stage of International Application No. PCT/JP2017/019407 filed May 24, 2017.

TECHNICAL FIELD

The present invention relates to a PLL frequency synthesizer.

BACKGROUND ART

In general, a phase locked loop (PLL) frequency synthesizer includes a voltage controlled oscillator (VCO), a phase comparison unit, a charge pump, and a loop filter, which form a loop. The PLL frequency synthesizer can output an oscillation signal having a frequency obtained by multiplying a frequency of a reference oscillation signal by a constant.

The PLL frequency synthesizer operates as described below. A control voltage value is input to the voltage controlled oscillator, and an oscillation signal having a frequency corresponding to the control voltage value is output from the voltage controlled oscillator. An oscillation signal output from the voltage controlled oscillator or a signal obtained by dividing the oscillation signal is input to the phase comparison unit as a feedback oscillation signal. Further, the reference oscillation signal is also input to the phase comparison unit. The phase comparison unit detects a phase difference between the feedback oscillation signal and the reference oscillation signal, and outputs a phase difference signal representing the detected phase difference.

A charge pump to which this phase difference signal is input outputs a charge and discharge current according to the phase difference represented by this phase difference signal. This charge and discharge current is input to the loop filter. For example, the loop filter includes a resistor and a capacitive element serially connected to each other, and also includes another capacitive elements provided in parallel to these. The control voltage value output from the loop filter is input to the voltage controlled oscillator. In this manner, the PLL frequency synthesizer outputs an oscillation signal having a frequency obtained by multiplying the frequency of the reference oscillation signal by a constant.

A transfer function of the PLL frequency synthesizer configured in the above manner depends on a characteristic based on a resistance value of the resistor and a capacitance value of the capacitive element included in the loop filter, a characteristic of the voltage controlled oscillator (a relationship between the control voltage value and the frequency of the oscillation signal), the charge and discharge current of the charge pump, and the like. For example, in a case where a resistor and a capacitive element are formed on a semiconductor substrate, a resistance value of the resistor may vary by about ±15%, and a capacitance value of the capacitive element may vary by about ±10%. With such variations in characteristics, there is a case where the actual transfer function of the PLL frequency synthesizer does not have a cutoff frequency and a peak gain as designed, and there is a case where required specifications are not satisfied.

Patent Literatures 1 and 2 disclose inventions intended to solve such problems. The invention disclosed in Patent Literature 1 monitors a control voltage value input to a voltage controlled oscillator, compares the control voltage value with a reference voltage value, and adjusts an output current of a charge pump and a characteristic of the voltage controlled oscillator based on a result of the comparison. The invention disclosed in Patent Literature 2 adjusts a characteristic of a voltage controlled oscillator using a frequency divider that divides an oscillation signal output from the voltage controlled oscillator to generate a feedback oscillation signal.

CITATION LIST

Patent Literature

Patent Literature 1: U.S. Pat. No. 7,772,930
Patent Literature 2: U.S. Pat. No. 8,483,985

SUMMARY OF INVENTION

Technical Problem

In the invention disclosed in Patent Literature 1, the reference voltage value may vary due to variation of a characteristic of a resistor or the like. In such a case, it is not easy to make an actual transfer function of the PLL frequency synthesizer as designed, since the variation of the reference voltage value affects an adjustment result.

In the invention disclosed in Patent Literature 2, since the characteristic of the voltage controlled oscillator is adjusted using the frequency divider, a frequency of the oscillation signal is changed due to the adjustment. It may be necessary to set a division ratio which cannot be realized in the frequency divider. Further, in a case where it is desired to make a frequency of an output oscillation signal the same as a frequency of the reference oscillation signal, the frequency of the oscillation signal is fluctuated by inserting the frequency divider for adjustment.

The present invention has been made to solve the above-mentioned problems, and it is an object of the present invention to provide a PLL frequency synthesizer which can easily realize a desired transfer function.

Solution to Problem

A PLL frequency synthesizer according to an aspect of the present invention includes (1) a voltage controlled oscillator configured to receive a control voltage value and output an oscillation signal having a frequency corresponding to the control voltage value, (2) a phase comparison unit configured to receive the oscillation signal output from the voltage controlled oscillator or a signal obtained by dividing the oscillation signal as a feedback oscillation signal, receive a reference oscillation signal, detect a phase difference between the feedback oscillation signal and the reference oscillation signal, and output a phase difference signal representing the phase difference, (3) a charge pump configured to receive the phase difference signal output from the phase comparison unit and output a charge and discharge current according to the phase difference represented by the phase difference signal, (4) a loop filter including a capacitive element that is charged and discharged by receiving the charge and discharge current output from the charge pump, and configured to output the control voltage value, which is increased or decreased according to a charge and discharge amount of the capacitive element, to the voltage controlled oscillator, (5) a detection unit configured to detect a change rate of the control voltage value when the charge and discharge current output from the charge pump is input to the loop filter, and (6) a control unit configured to adjust the charge and discharge current output from the charge pump, a characteristic of the loop filter, or a characteristic of the voltage controlled oscillator based on a detection result of the detection unit.

In one embodiment, the detection unit may detect the change rate of the control voltage value using the reference oscillation signal. In one embodiment, the PLL frequency synthesizer may further include a setting unit that sets the control voltage value to a predetermined value, and the detection unit may detect the change rate of the control voltage value from the predetermined value. In one embodiment, the setting unit may include an amplifier in a voltage follower configuration.

In one embodiment, the charge pump may include a plurality of current sources provided in parallel, and the control unit may adjust the charge and discharge current output from the charge pump by changing the number of current sources to be used among the plurality of current sources of the charge pump. In one embodiment, the loop filter may include a resistor having a first end to which the charge and discharge current output from the charge pump is input and a second end, and a capacitive element connected to the second end of the resistor, and the detection unit may monitor a potential of the first end or the second end of the resistor to detect the change rate of the control voltage value. In one embodiment, the loop filter may include a resistor having a first end to which the charge and discharge current output from the charge pump is input and a second end, and a capacitive element connected to the second end of the resistor, the setting unit may set a potential of the first end or the second end of the resistor to a predetermined value, and the detection unit may monitor the potential of the first end or the second end of the resistor to detect the change rate of the control voltage value.

In one embodiment, the loop filter may include a first capacitive element, a second capacitive element having a capacitance value larger than that of the first capacitive element, and a switch for connecting the first capacitive element and the second capacitive element in parallel with each other, the detection unit may detect the change rate of the control voltage value and the control unit may perform adjustment in a state where the second capacitive element is disconnected by the switch, and the second capacitive element may be connected in parallel to the first capacitive element by the switch after adjustment by the control unit.

In one embodiment, the PLL frequency synthesizer may include a first charge pump and a second charge pump as the charge pump, the loop filter may include a capacitive element connected to an output end of the first charge pump, an amplifier for outputting a voltage value according to a voltage value of the capacitive element, and a resistor having a first end connected to an output end of the amplifier and a second end connected to an output end of the second charge pump, and may output the control voltage value from the second end to the voltage controlled oscillator, and the control unit may adjust the charge and discharge current output from the first charge pump.

In one embodiment, the voltage controlled oscillator may be a voltage controlled oscillator of an LC-VCO type that includes a capacitive element having a capacitance value that changes depending on the control voltage value, and outputs the oscillation signal having a frequency according to the capacitance value of the capacitive element, and the control unit may adjust the characteristic of the voltage controlled oscillator by changing dependency of the capacitance value of the capacitive element on the control voltage value.

In one embodiment, the voltage controlled oscillator may be a voltage controlled oscillator of a Ring-VCO type that has a configuration in which a plurality of inverter circuits are connected in a ring shape, and outputs the oscillation signal having a frequency according to current supplied to the plurality of inverter circuits, and the control unit may adjust the characteristic of the voltage controlled oscillator by changing dependency of a current supply amount to the inverter circuits on the control voltage value.

Advantageous Effects of Invention

A PLL frequency synthesizer of the present invention can easily realize a desired transfer function even if parameters (for example, a resistance value, a capacitance value, current of a charge pump, and the like) of a PLL do not reach a desired value due to manufacturing variation.

BRIEF DESCRIPTION OF DRAWINGS

FIG. 10 is a table showing output setting in each state in the state machine SCPCC.

FIG. 12 is a table showing output settings in each state in the state machine SCPCCNT.

FIG. 15 is a table showing output setting in each state in the state machine SCSG

DESCRIPTION OF EMBODIMENTS

Hereinafter, with reference to the accompanying drawings, modes for carrying out the present invention will be described in detail. Note that the same elements will be attached with the same reference signs in description of the drawings to omit duplicate description. The present invention is not limited by these exemplifications, and is intended to be shown by claims and include all changes made within the meaning and the scope equivalent to those of claims.

Figure 1:
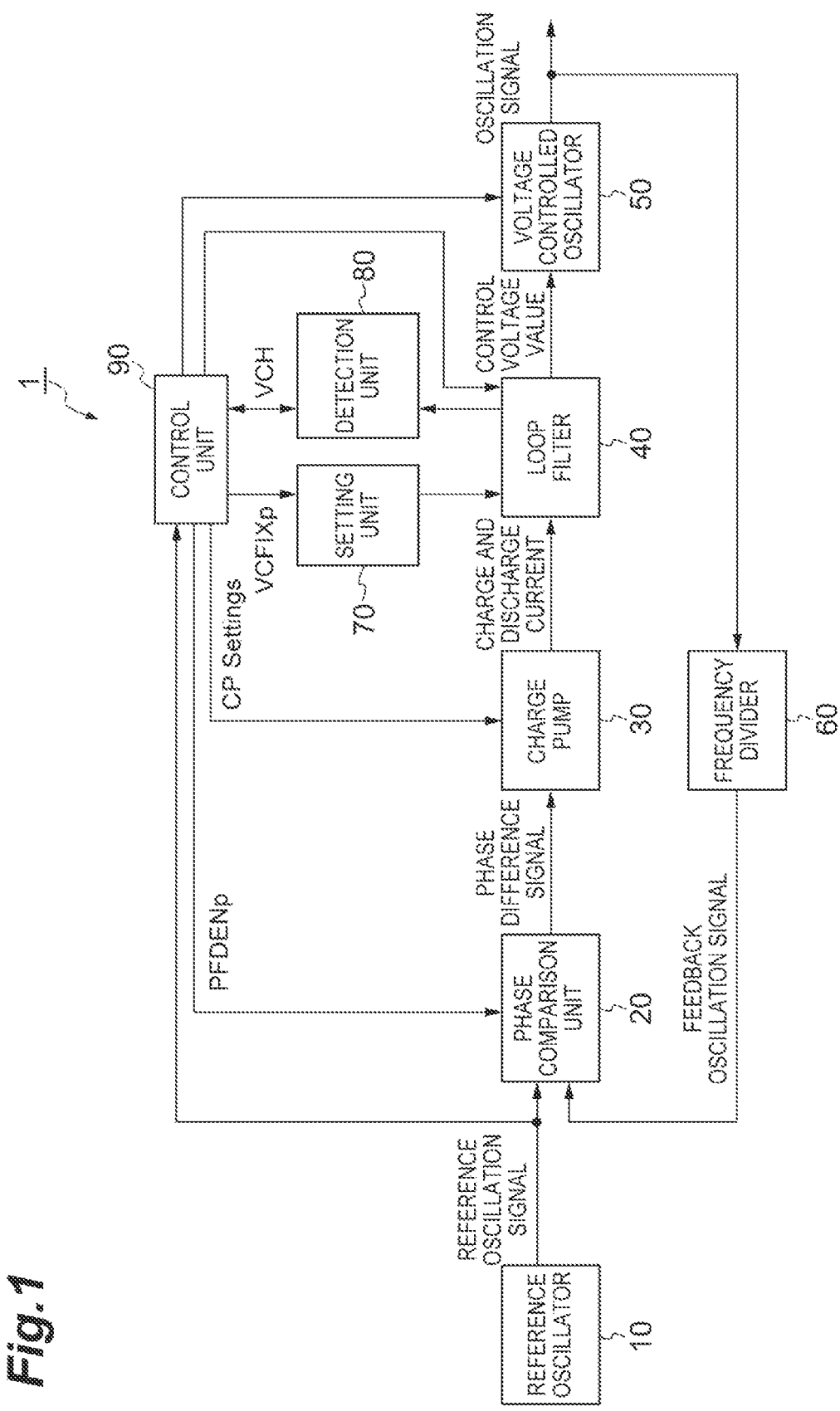
FIG. 1 is a diagram showing a configuration of a PLL frequency synthesizer 1.

FIG. 1 is a diagram showing a configuration of a PLL frequency synthesizer 1. The PLL frequency synthesizer 1 includes a reference oscillator 10, a phase comparison unit 20, a charge pump 30, a loop filter 40, a voltage controlled oscillator 50, a frequency divider 60, a setting unit 70, a detection unit 80, and a control unit 90.

The reference oscillator 10 includes, for example, a quartz oscillator, and outputs a reference oscillation signal having a constant frequency stabilized with high accuracy to the phase comparison unit 20. The phase comparison unit 20 receives this reference oscillation signal. The phase comparison unit 20 receives a feedback oscillation signal output from the frequency divider 60. The phase comparison unit 20 is a circuit that detects a phase difference between the feedback oscillation signal and the reference oscillation signal and outputs a phase difference signal representing this phase difference to the charge pump 30. The phase difference signal indicates which of the reference oscillation signal and the feedback oscillation signal is advanced in phase.

The charge pump 30 is a circuit that receives the phase difference signal output from the phase comparison unit 20 and outputs a charge and discharge current according to the phase difference represented by the phase difference signal to the loop filter 40. The charge and discharge current output from the charge pump 30 to the loop filter 40 differs in polarity depending on which of the reference oscillation signal and the feedback oscillation signal is advanced in phase. The loop filter 40 is a circuit including a capacitive element which is charged and discharged by receiving the charge and discharge current output from the charge pump 30, and outputs a control voltage value which is increased or decreased according to the charge and discharge amount to the voltage controlled oscillator 50. The loop filter 40 includes a resistor in addition to the capacitive element.

The voltage controlled oscillator 50 is a circuit which receives the control voltage value output from the loop filter 40 and outputs an oscillation signal having a frequency corresponding to the control voltage value. The frequency divider 60 is a circuit that receives the oscillation signal output from the voltage controlled oscillator 50, divides the oscillation signal by N to generate a feedback oscillation signal, and outputs the feedback oscillation signal to the phase comparison unit 20.

The phase comparison unit 20, the charge pump 30, the loop filter 40, the voltage controlled oscillator 50, and the frequency divider 60 constitute a loop. In this loop, a charge and discharge current is input from the charge pump 30 to the loop filter 40, so that a phase difference between the reference oscillation signal and the feedback oscillation signal input to phase comparison unit 20 becomes small. Then, in a state where operation of this loop is stable, the oscillation signal output from the voltage controlled oscillator 50 has a frequency that is N times the frequency of the reference oscillation signal. Note that the frequency divider 60 does not need to be provided, and, in this case, the oscillation signal output from the voltage controlled oscillator 50 has the same frequency as the frequency of the reference oscillation signal.

Details of the setting unit 70, the detection unit 80, and the control unit 90 will be described later.

Figure 2:
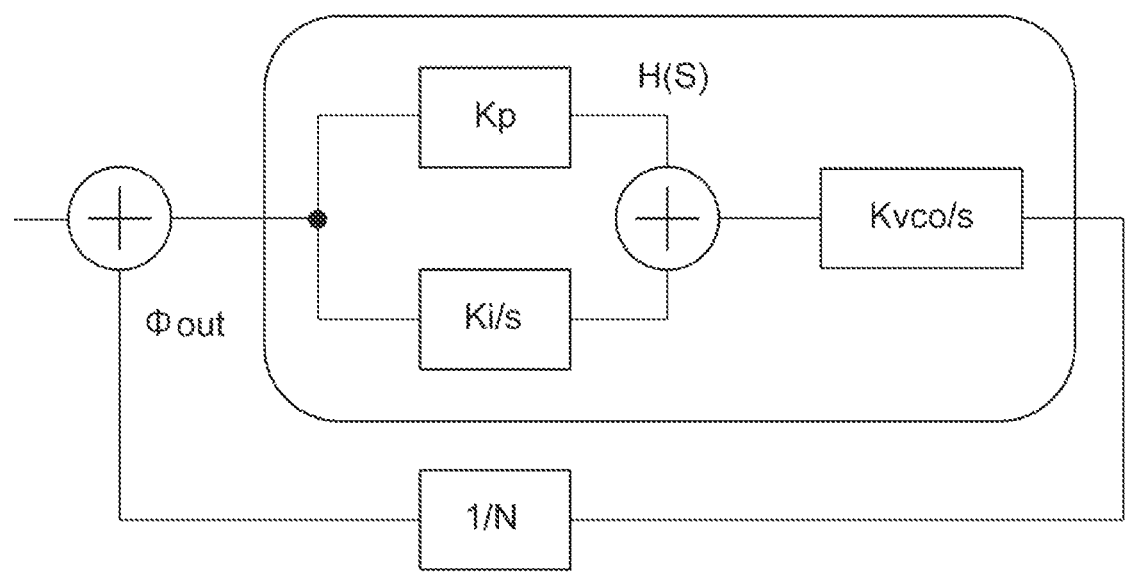
FIG. 2 is a diagram showing a phase domain model of the PLL frequency synthesizer 1.

FIG. 2 is a diagram showing a phase domain model of the PLL frequency synthesizer 1. An open loop characteristic H(s) of the PLL frequency synthesizer 1 is expressed by Equation (1) described below. Kvco indicates a characteristic of the voltage controlled oscillator 50 (dependency of a frequency of an oscillation signal on a control voltage value). Kp is a proportional term of the loop filter 40, and is expressed by Equation (2) described below. Ki is an integration term of the loop filter 40 and is expressed by Equation (3) described below. R is a resistance value of a resistor included in the loop filter 40. C is a capacitance value of a capacitive element included in the loop filter 40.

[Equation 1]

$$H(s) = \frac{Kvco}{s}\left(Kp + \frac{Ki}{s}\right) \quad (1)$$

[Equation 2]

$$Kp = Icpp \cdot R \quad (2)$$

[Equation 3]

$$Ki = \frac{Icpi}{C} \quad (3)$$

Icpp is current that contributes to the proportional term of a charge and discharge current Icp supplied from the charge pump 30 to the loop filter 40. Icpi is current that contributes to the integration term of the charge and discharge current Icp supplied from the charge pump 30 to the loop filter 40. In general, a relationship of Equation (4) described below may be established.

[Equation 4]

$$Icp=Icpp=Icpi \quad (4)$$

In general, the current output from charge pump 30 is generated based on a voltage value Vref supplied from a band gap reference (BGR) block. The charge and discharge current Icp provided from the charge pump 30 to the loop filter 40 is expressed by Equation (5) described below.

[Equation 5]

$$Ic = \frac{Vref}{R} \quad (5)$$

If Equation (5) is used, Equation (2) is transformed into Equation (6) described below. As can be seen from Equation (6), the proportional term Kp of the loop filter 40 does not depend on either the resistance value R or the capacitance value C. Since the voltage value Vref supplied from the BGR block is excellent in stability, the proportional term Kp of the loop filter 40 is excellent in stability.

[Equation 6]

$$Kp=Vref \quad (6)$$

Further, if Equation (5) is used, Equation (3) is transformed into Equation (7) described below. As can be seen from Equation (7), the integration term Ki of the loop filter 40 depends on both the resistance value R and the capacitance value C. Therefore, when the resistance value R or the capacitance value C varies, the integration term Ki of the loop filter 40 also varies.

[Equation 7]

$$Ki = \frac{Vref}{C \cdot R} \qquad (7)$$

When the open loop characteristic H(s) of the PLL frequency synthesizer 1 varies due to variation of the resistance value R or the capacitance value C as described above, there is a case where the actual transfer function of the PLL frequency synthesizer 1 does not have a cutoff frequency and a peak gain as designed, and there is a case where required specifications are not satisfied. In order to solve such a problem, the PLL frequency synthesizer 1 of the present embodiment includes the setting unit 70, the detection unit 80, and the control unit 90 to facilitate realization of a desired transfer function.

The detection unit 80 is a circuit that detects a change rate of the control voltage value when a constant current output from the charge pump 30 is input to the loop filter 40. The detection unit 80 may measure control voltage values V1 and V2 at optional two times t1 and t2, respectively. The detection unit 80 may measure the time t2 at which the control voltage value changes to V2 by a predetermined voltage difference ΔV after the setting unit 70 sets the control voltage value to the initial value V1 at the time t1. Further, the detection unit 80 may also measure the control voltage value V2 at the time t2 after a predetermined time Δt elapses from the time t1 at which the setting unit 70 sets the control voltage value to the initial value V1. In any case, the change rate ΔV/Δt of the control voltage value is expressed by Equation (8) described below.

[Equation 8]

$$\frac{\Delta V}{\Delta t} = \frac{V2 - V1}{t2 - t1} \qquad (8)$$

The control unit 90 is a controller that controls the overall operation of the PLL frequency synthesizer 1. As the control unit 90, for example, a processor, such as a central processing unit (CPU) and a field programmable gate array (FPGA), is used. In particular, based on a detection result by the detection unit 80, the control unit 90 adjusts the charge and discharge current Icp output from the charge pump 30, a characteristic of the loop filter 40 (in particular, a characteristic based on the resistance value R of the resistor and the capacitance value C of the capacitive element), or the characteristic Kvco of the voltage controlled oscillator 50 (dependency of a frequency of the oscillation signal on the control voltage value).

Figure 3:
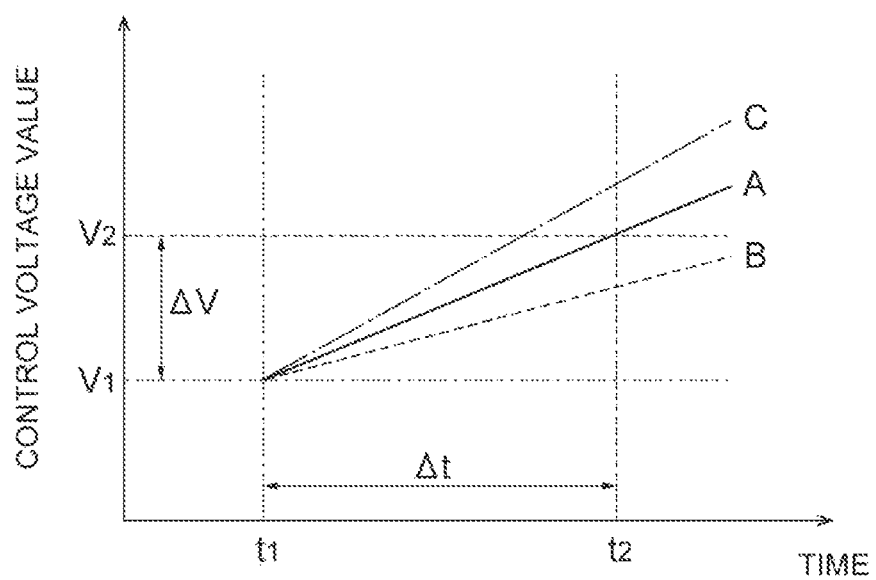
FIG. 3 is a diagram for explaining an example of adjustment operation by a control unit 90 of the PLL frequency synthesizer 1.

FIG. 3 is a diagram for explaining an example of adjustment operation by the control unit 90 of the PLL frequency synthesizer 1. In this diagram, the horizontal axis indicates a time, and the vertical axis indicates a control voltage value. In this diagram, three straight lines A, B, and C indicate change rates of control voltage values different from one another. Assuming that the change rate of the control voltage value indicated by the straight line A is preferable, the change rate of the control voltage value indicated by the straight line B is low and the change rate of the control voltage value indicated by the straight line C is high. The control unit 90 performs adjustment so that the preferable change rate of the control voltage value indicated by the straight line A is obtained.

An example of the adjustment operation by the control unit 90 of the PLL frequency synthesizer 1 is as described below. In a first step, the control unit 90 causes the setting unit 70 to set the control voltage value to V1. In a subsequent second step, the control unit 90 causes the phase comparison unit 20 to output a phase difference signal for a certain time Δt, and causes the charge pump 30 to supply the constant current Icp to the loop filter 40. In the second step performed first, a current amount is made a settable minimum value.

In a subsequent third step, the control unit 90 acquires the control voltage value measured by the detection unit 80 after the end of the second step. Then, in a fourth step, in a case where the control unit 90 determines that the control voltage value measured in the third step does not exceed the predetermined value V2, the set value of the current Icp is increased and the first and subsequent steps are repeated. When determining that the control voltage value measured in the third step exceeds the predetermined value V2, the control unit 90 ends the adjustment operation.

In this operation example, the control unit 90 sets the initial value of the current Icp as the settable minimum value, and then gradually increases the current Icp. However, the present invention is not limited this example. The control unit 90 may set the initial value of the current Icp as a settable maximum value, and then gradually decrease the current Icp. The control unit 90 may set the initial value of the current Icp as an optional value, and gradually increase the current Icp if the control voltage value measured in the third step at this initial value is less than the predetermined value V2, and gradually decrease the current Icp if the control voltage value measured in the third step at this initial value is larger than the predetermined value V2.

The time Δt during which current is supplied from the charge pump 30 to the loop filter 40 can be monitored using a counter that counts a pulse of the reference oscillation signal (or other signal whose frequency is stabilized) output from reference oscillator 10. That is, the time Δt can be obtained from Equation (9) described below using a count value M by the counter and a frequency F of the reference oscillation signal.

[Equation 9]

$$\Delta t = \frac{M}{F} \qquad (9)$$

The current Icpi supplied from the charge pump 30 to the loop filter 40 is represented by (10) described below by using the time Δt for supplying current from the charge pump 30 to the loop filter 40, the voltage difference ΔV between the initial value V1 of the control voltage value and the predetermined value V2 at the end of adjustment, and the capacitance value C of the capacitive element included in the loop filter 40. When Equation (10) is used, Equation (3) is transformed into Equation (11) described below.

[Equation 10]

$$Icpi = \frac{C \cdot \Delta V}{\Delta t} = \frac{C \cdot (V2 - V1) \cdot F}{M} \qquad (10)$$

[Equation 11]

$$Ki = \frac{Icpi}{C} = \frac{\Delta V}{\Delta t} = \frac{(V2 - V1) \cdot F}{M} \qquad (11)$$

Since the voltage difference ΔV is generated by the BGR block, the variation of the voltage difference ΔV is small. Since the time Δt can be obtained using the reference oscillation signal output from the reference oscillator 10, the variation of the time Δt is small. Equation (11) does not depend on either the resistance value R or the capacitance value C. By adjusting the current Icpi, the change rate of the control voltage value can be set to a desired value, and the integration term Ki can be set to a desired value.

Figure 4:
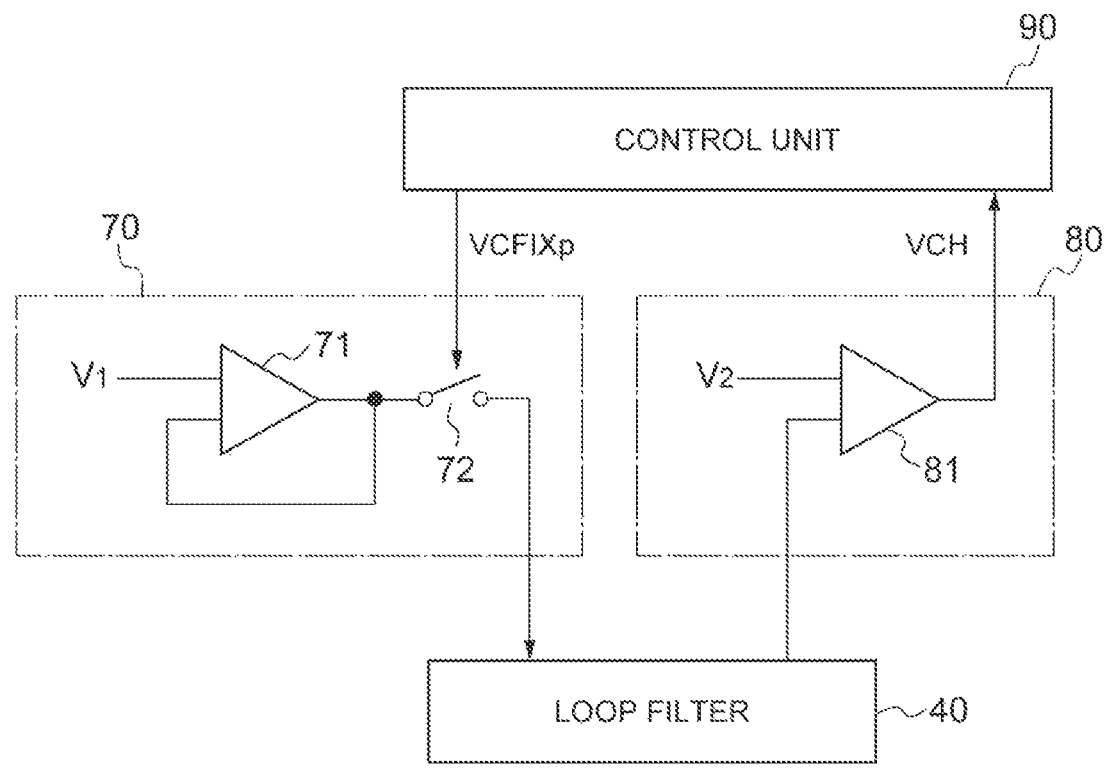
FIG. 4 is a diagram showing a configuration example of a setting unit 70 and a detection unit 80.

FIG. 4 is a diagram showing a configuration example of the setting unit 70 and the detection unit 80. The setting unit 70 includes an amplifier 71 and a switch 72. The amplifier 71 has two input ends and one output end, the voltage value V1 is input to one of the input ends, and the other input end is connected to the output end. The amplifier 71 has a voltage follower configuration. A first end of the switch 72 is connected to the output end of the amplifier 71, and a second end of the switch 72 is connected to a location where the control voltage value is to be set to V1. The open and close operation of the switch 72 is controlled by a VCFIXp signal output from the control unit 90.

The detection unit 80 includes an amplifier 81. The amplifier 81 has two input ends and one output end, the voltage value V2 is input to one of the input ends, the control voltage value is input to the other input end, and a VCH signal is output from the output end to the control unit 90. The amplifier 81 sets the VCH signal to a low level when the control voltage value is V2 or less, and sets the VCH signal to a high level when the control voltage value is larger than V2.

The control unit 90 sets the control voltage value to the initial value V1 by switching the switch 72 of the setting unit 70 to an ON state for a certain period by the VCFIXp signal. The control unit 90 switches the switch 72 to an OFF state at the time t1, and detects a level of the VCH signal output from the amplifier 81 of the detection unit 80 at the time t2 after that. The control unit 90 can obtain, based on the level of the VCH signal, whether the change rate of the control voltage value is larger or smaller than a target value.

Figure 5:
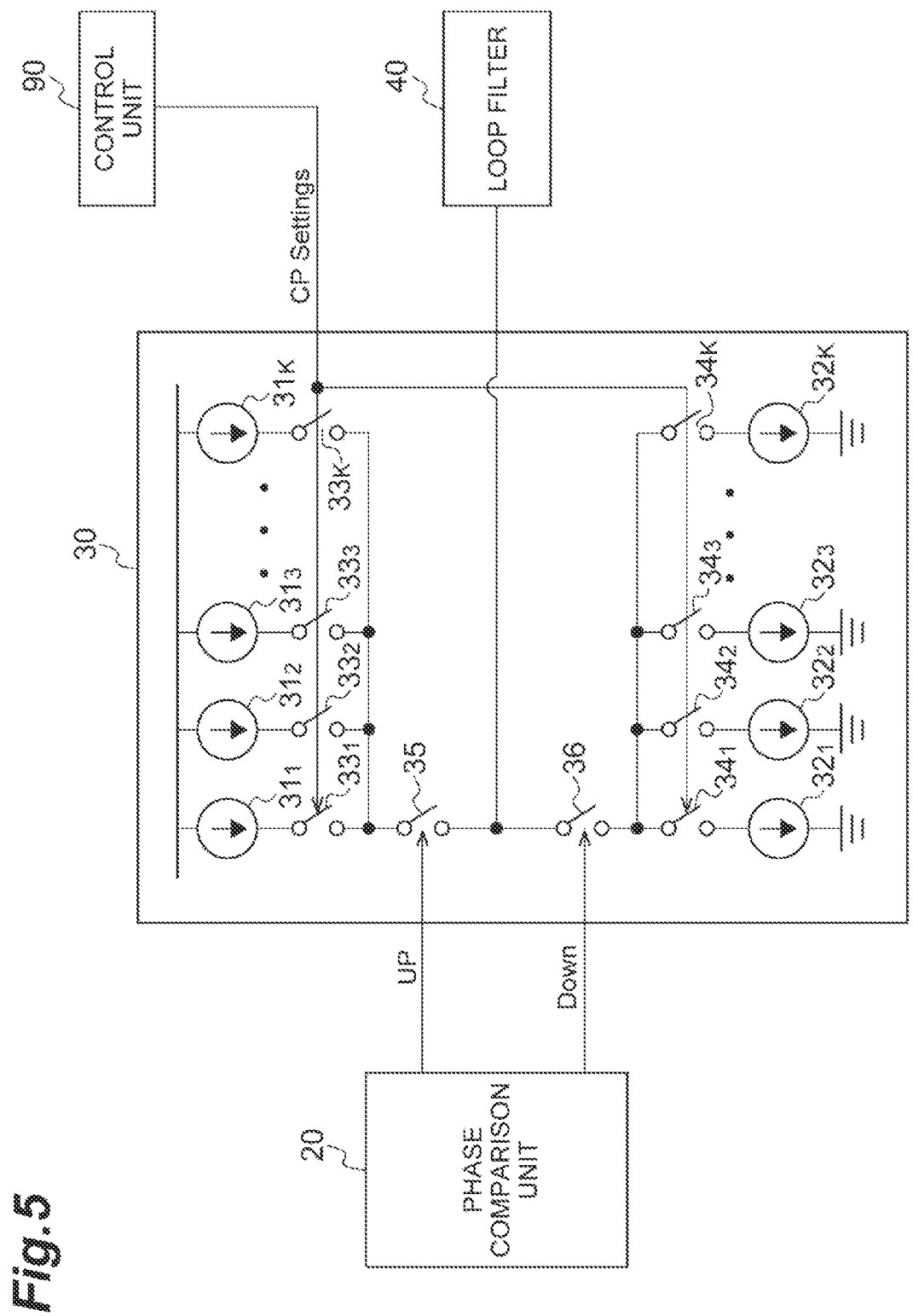
FIG. 5 is a diagram showing a configuration example of a charge pump 30.

FIG. 5 is a diagram showing a configuration example of the charge pump 30. The charge pump 30 includes current sources $31_1$ to $31_K$, current sources $32_1$ to $32_K$, switches $33_1$ to $33_K$, switches $34_1$ to $34_K$, a switch 35, and a switch 36. K is an integer of 2 or more, and k is an integer of 1 or more and K or less.

The current source $31_k$ and the switch $33_k$ are connected in series with each other and provided between a power supply potential having high potential and the switch 35. The current source $32_k$ and the switch $34_k$ are connected in series with each other and provided between a ground potential having low potential and the switch 36. The connection point between the switch 35 and the switch 36 is connected to the loop filter 40.

Open and close states of the switches $33_1$ to $33_K$ and the switches $34_1$ to $34_K$ are set by a CPSetting signal output from the control unit 90. The open and close operation of the switches 35 and 36 is controlled by the phase difference signal (UP signal, DOWN signal) output from the phase comparison unit 20. The switch 35 and the switch 36 are not simultaneously in the ON state.

When the switch 35 is in the ON state, the capacitive element of the loop filter 40 is charged. A charge amount at that time has a value corresponding to the number of switches in the ON state among the switches $33_1$ to $33_K$. Further, when the switch 36 is in the ON state, the capacitive element of the loop filter 40 is discharged. The discharge amount at that time has a value corresponding to the number of switches in the ON state among the switches $34_1$ to $34_K$.

The control unit 90 adjusts the number of switches in the ON state among the switches $33_1$ to $33_K$ and adjusts the number of switches in the ON state among the switches $34_1$ to $34_K$ by the CPSetting signal. In this manner, the charge and discharge current Icp provided from the charge pump 30 to the loop filter 40 can be adjusted.

Figure 6:
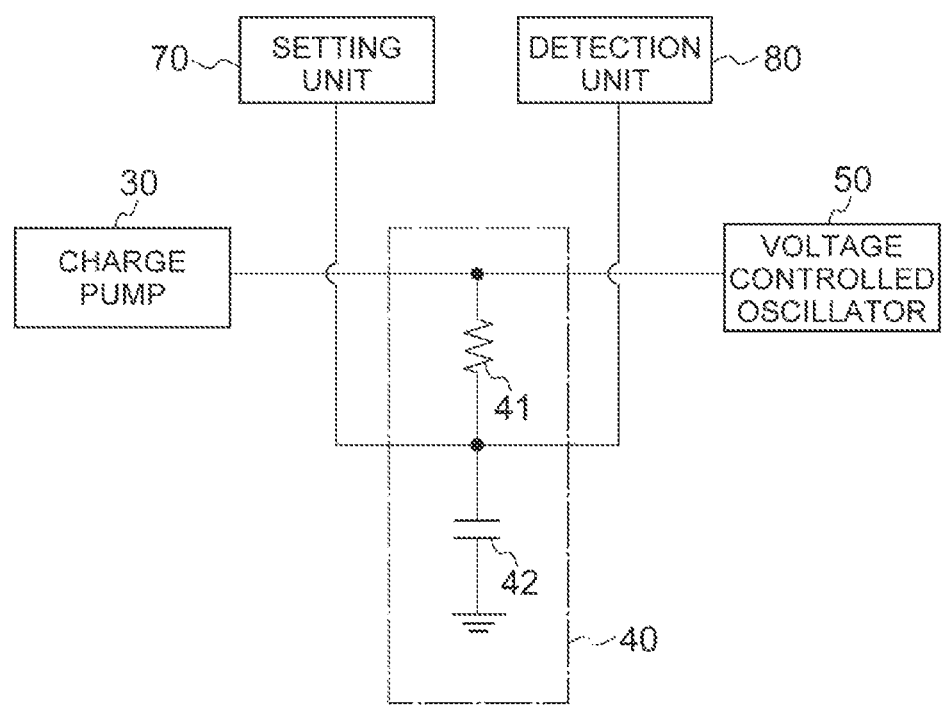
FIG. 6 is a diagram showing a configuration example of a loop filter 40.

FIG. 6 is a diagram showing a configuration example of the loop filter 40. The loop filter 40 shown in this diagram includes a resistor 41 and a capacitive element 42. A first end of the resistor 41 receives charge and discharge current output from the charge pump 30. A second end of the resistor 41 is connected to the capacitive element 42. In the loop filter 40 having such a configuration, the setting unit 70 may set the second end of the resistor 41 (the connection point between the resistor 41 and the capacitive element 42) to the initial value V1, and the detection unit 80 may detect a voltage value at the second end of the resistor 41 as the control voltage value.

If a resistance value of the resistor 41 is variable, the control unit 90 can adjust a characteristic of the loop filter 40 by adjusting a resistance value of the resistor 41. Further, if a capacitance value of the capacitive element 42 is variable, the control unit 90 can adjust a characteristic of the loop filter 40 by adjusting a capacitance value of the capacitive element 42.

Figure 16:
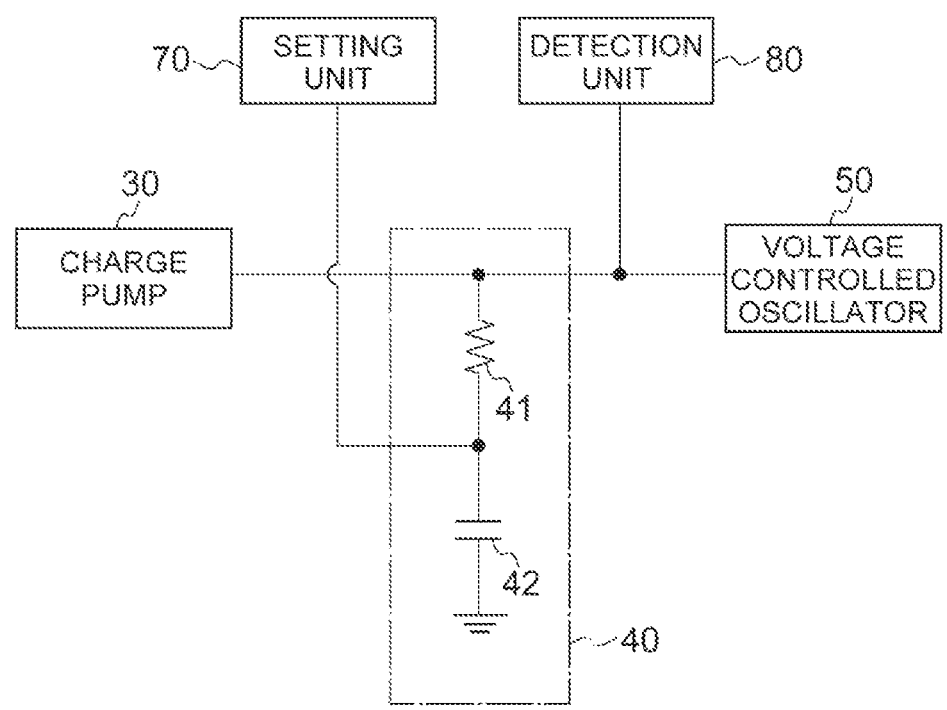
FIG. 16 is a diagram showing a configuration example of the loop filter 40.
Figure 17:
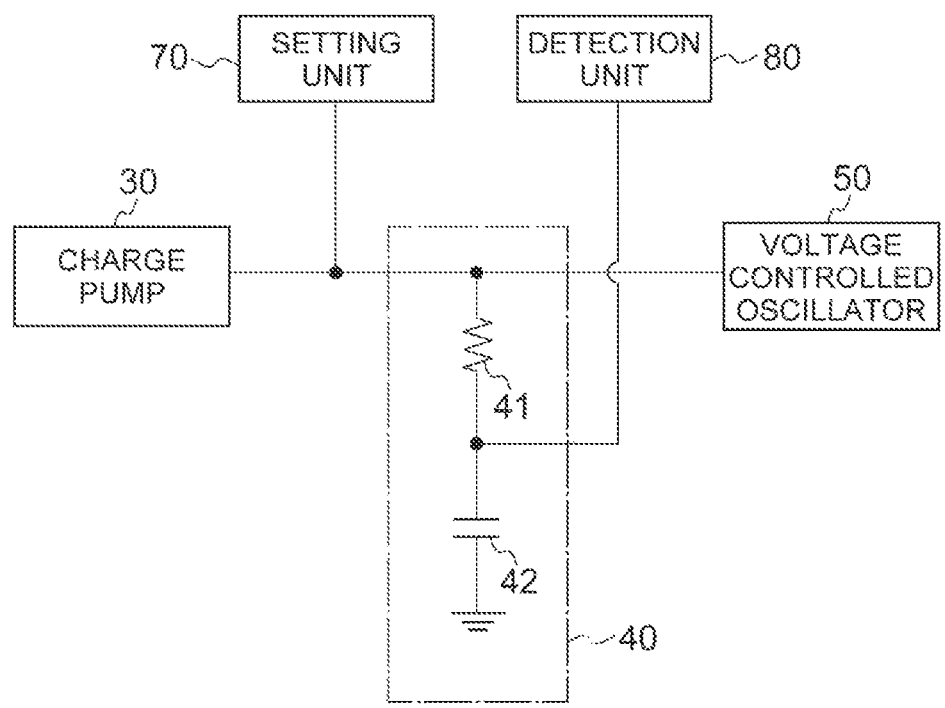
FIG. 17 is a diagram showing a configuration example of the loop filter 40.
Figure 18:
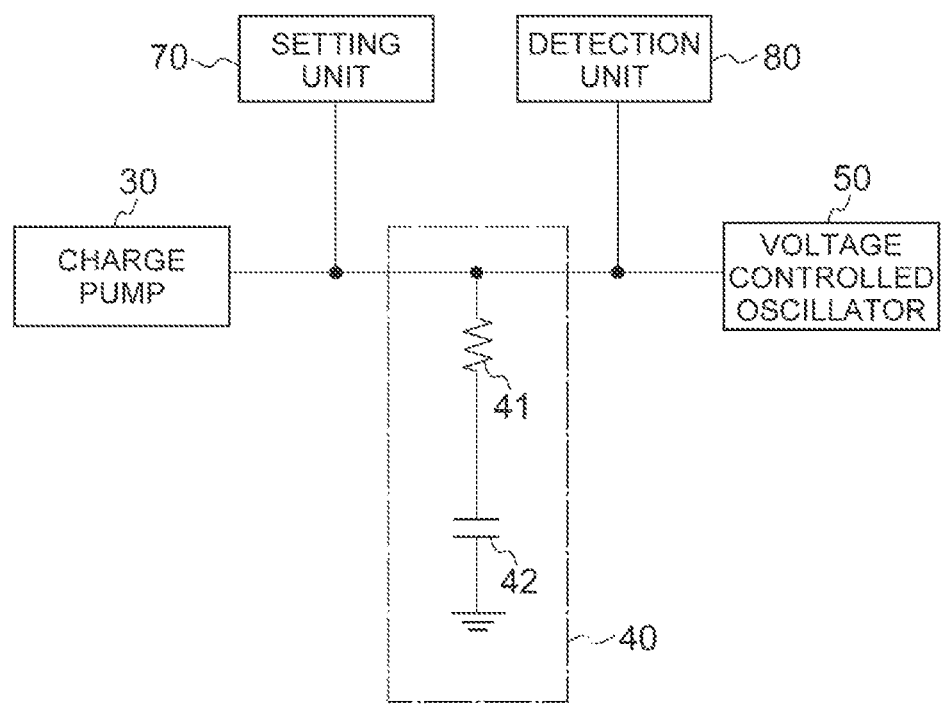
FIG. 18 is a diagram showing a configuration example of the loop filter 40.

Note that, as shown in FIG. 16, the setting unit 70 may set the second end of the resistor 41 to the initial value V1, and the detection unit 80 may detect a voltage value of the first end of the resistor 41 as the control voltage value. As shown in FIG. 17, the setting unit 70 may set the first end of the resistor 41 to the initial value V1, and the detection unit 80 may detect a voltage value of the second end of the resistor 41 as the control voltage value. As shown in FIG. 18, the setting unit 70 may set the first end of the resistor 41 to the initial value V1, and the detection unit 80 may detect a voltage value of the first end of the resistor 41 as the control voltage value.

Figure 7:
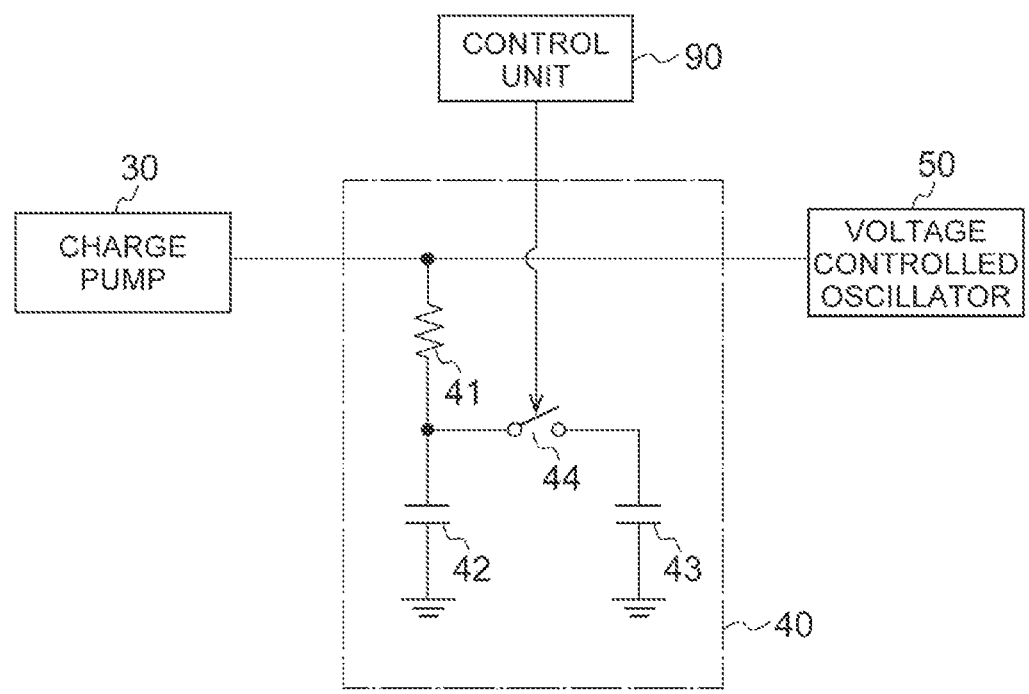
FIG. 7 is a diagram showing another configuration example of the loop filter 40.

FIG. 7 is a diagram showing another configuration example of the loop filter 40. The loop filter 40 shown in this diagram includes a capacitive element 43 and a switch 44 in addition to the resistor 41 and the capacitive element 42. The switch 44 is provided between the connection point between the resistor 41 and the capacitive element 42 and the capacitive element 43. When the switch 44 is in the ON state, the capacitive element 42 and the capacitive element 43 are in a state of being connected in parallel to each other. A capacitance value of the capacitive element 43 is larger than a capacitance value of the capacitive element 42.

The open and close state of the switch 44 is set by a signal output from the control unit 90. The capacitance value of the loop filter 40 is small when the switch 44 is in the OFF state, and the capacitance value of the loop filter 40 is large when the switch 44 is in the ON state. The control unit 90 performs the adjustment with the switch 44 in the OFF state, and switches the switch 44 in the ON state after the adjustment is finished.

The configuration of the loop filter 40 shown in FIG. 7 is useful in a case described below. That is, in order to reduce the influence of an input jitter, it is preferable to lower a cutoff frequency of the loop filter, in which case a capacitive element having a large capacitance value is used. When a capacitance value of the loop filter is large, a change rate of the control voltage value becomes low, and the time Δt required for the control voltage value to change from the initial value V1 to V2 by the voltage difference ΔV becomes long. For example, the voltage difference ΔV is set to 0.5 V, the capacitance value is set to 220 pF, and the current Icp output from the charge pump is set to 20 μA. At this time, the time Δt is 5.5 μs. The circuit scale of the counter that counts over a long time of 5.5 μs is large. Although it is possible to measure the time by an analog circuit using a resistor and a capacitive element, it is not realistic because the variation of the resistor and the capacitance value is several tens of percent.

In such a case, in order to shorten the time required for the adjustment, the switch 44 is set in the OFF state to reduce a capacitance value when the adjustment is performed, so as to achieve shortening of the adjustment time (for example, to several tens of nanoseconds). Then, after the adjustment is finished, the switch 44 is set to the ON state to increase the capacitance value. In this manner, the influence of the input jitter can be reduced.

Figure 8:
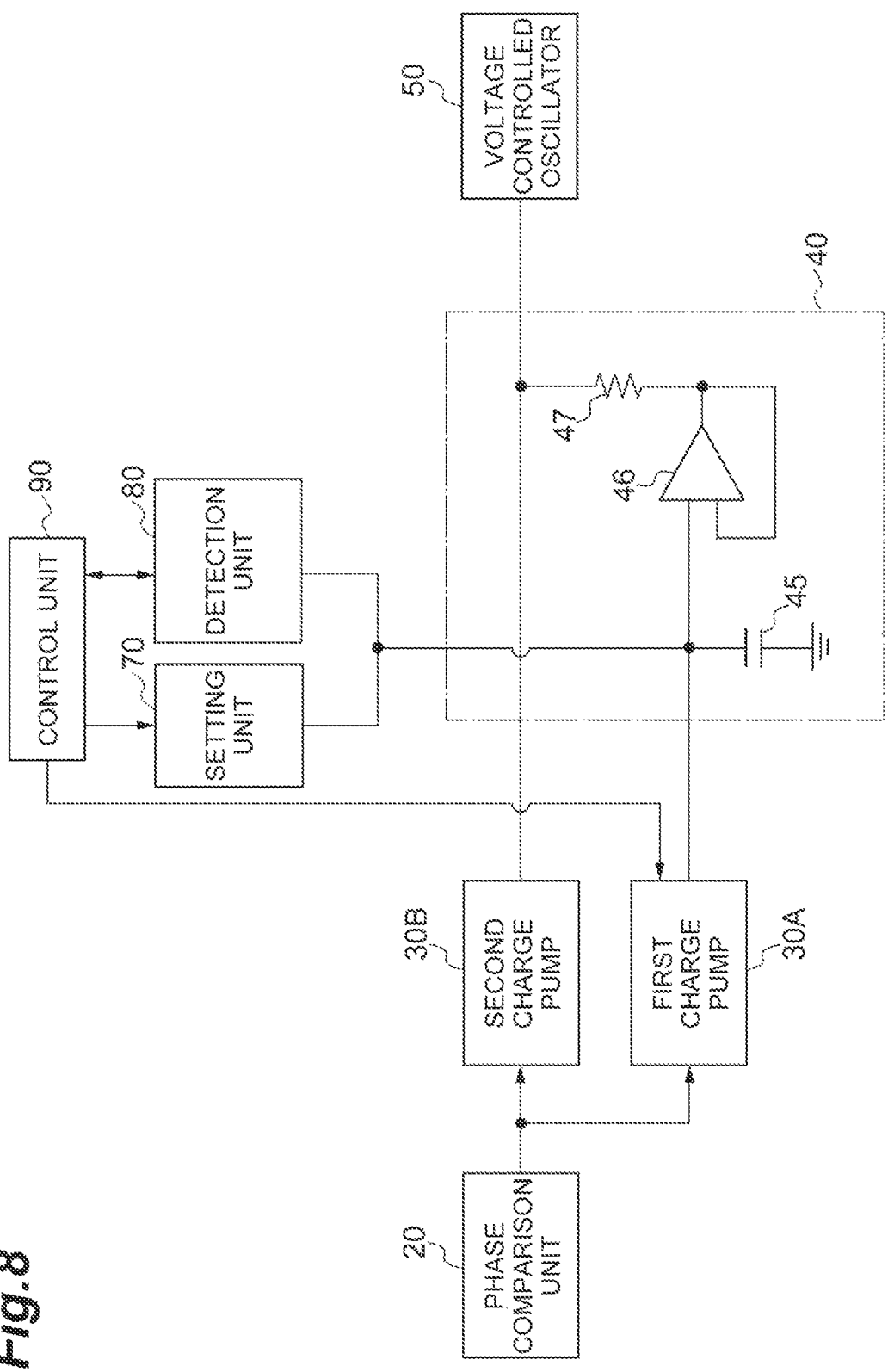
FIG. 8 is a diagram showing still another configuration of the loop filter 40.

FIG. 8 is a diagram showing still another configuration of the loop filter 40. In the configuration shown in this diagram, a first charge pump 30A and a second charge pump 30B are provided as the charge pumps. The loop filter 40 includes a capacitive element 45, an amplifier 46, and a resistor 47.

The capacitive element 45 is provided between an output end of the first charge pump 30A and a ground potential end. The amplifier 46 has two input ends and one output end, a voltage value of the capacitive element 45 is input to one of the input ends, and the other input end is connected to the output end. The amplifier 46 has a voltage follower configuration. The amplifier 46 outputs a voltage value corresponding to the voltage value of the capacitive element 45 from the output end. A first end of the resistor 47 is connected to the output end of the amplifier 46, and a second end of the resistor 47 is connected to an output end of the second charge pump 30B. The potential at the second end of the resistor 47 is output to the voltage controlled oscillator 50 as the control voltage value.

The first charge pump 30A outputs charge and discharge current that contributes to an integration term of the loop filter 40. The second charge pump 30B outputs charge and discharge current that contributes to a proportional term of the loop filter 40. The control unit 90 adjusts the charge and discharge current output from the first charge pump 30A.

If a resistance value of the resistor 47 is variable, the control unit 90 can adjust a characteristic of the loop filter 40 by adjusting the resistance value of the resistor 47. If a capacitance value of the capacitive element 45 is variable, the control unit 90 can adjust a characteristic of the loop filter 40 by adjusting the capacitance value of the capacitive element 45.

The control unit 90 may adjust the characteristic Kvco of the voltage controlled oscillator 50. In a case where the voltage controlled oscillator 50 is a voltage controlled oscillator of an LC-VCO type, that is, a voltage controlled oscillator of a type that includes a capacitive element having a capacitance value that changes according to the control voltage value, and outputs an oscillation signal having a frequency according to the capacitance value of this capacitive element, the control unit 90 can adjust a characteristic of the voltage controlled oscillator 50 by changing the dependency of the capacitance value of the capacitive element on the control voltage value. The capacitive element may be a varactor, or may have a configuration in which the drain and source of an MOS transistor are connected to each other. Adjustment of the capacitance value of the capacitive element is possible by providing in parallel a plurality of sets of a capacitive element and a switch connected in series, and adjusting the number of switches in the ON state among a plurality of the switches.

In a case where the voltage controlled oscillator is a voltage controlled oscillator of a Ring-VCO type, that is, a voltage controlled oscillator of a type that has a configuration in which a plurality of inverter circuits are connected in a ring shape, and outputs an oscillation signal having a frequency according to current supplied to the inverter circuits, the control unit 90 can adjust a characteristic of the voltage controlled oscillator 50 by changing the dependency of a current supply amount to the inverter circuits on the control voltage value.

In the present embodiment, the detection unit 80 detects a change rate of the control voltage value when the charge and discharge current output from the charge pump 30 is input to the loop filter 40, and, based on a detection result, the control unit 90 adjusts the charge and discharge current output by the charge pump 30, a characteristic of the loop filter 40, or a characteristic of the voltage controlled oscillator 50. Therefore, a desired transfer function can be easily realized.

That is, in the invention disclosed in Patent Literature 1, adjustment is performed based on a comparison result of the control voltage value and one reference voltage value. Accordingly, when the reference voltage value varies due to the variation of a characteristic of the resistor or the like, the variation in the reference voltage value affects an adjustment result. For this reason, it is not easy to make an actual transfer function of the PLL frequency synthesizer as designed. On the other hand, in the present embodiment, even if the voltage values V1 and V2 vary due to the variation of the characteristic of the resistor and the like, the variation does not affect a change rate (ΔV/Δt) of the control voltage value. Accordingly, a desired transfer function can be easily realized. In the present embodiment, since the amplifier 71 of the setting unit 70 and the amplifier 81 of the detection unit 80 can be amplifiers having the same characteristics, the influence of an offset of these amplifiers is also suppressed.

Further, in the invention disclosed in Patent Literature 2, there arises a problem due to adjustment of a characteristic of the voltage controlled oscillator using a frequency divider. On the other hand, in the present embodiment, adjustment can be performed without using a frequency divider. Accordingly, a desired transfer function can be easily realized even in a configuration in which no frequency divider is provided.

Next, control by the control unit 90 in the PLL frequency synthesizer 1 of the present embodiment will be described in detail. Here, one aspect of control by the control unit 90 in a case of adjusting the charge and discharge current Icp of the charge pump 30 in the configuration shown in FIGS. 1, 4, and 5 will be described. FIGS. 9 to 15 are diagrams for explaining a state machine for explaining control by the control unit 90.

The control by the control unit 90 includes four state machines SCPCC, SCPCCNT, SCPCTL, and SCSG. The state machine SCPCC supervises the entire adjustment operation, and controls operation of each of the setting unit 70 and the detection unit 80. The state machine SCPCCNT controls counting operation of the counter. The state machine SCPCTL controls current output operation of the charge pump 30. The state machine SCSG determines the end of the adjustment operation.

Figure 9:
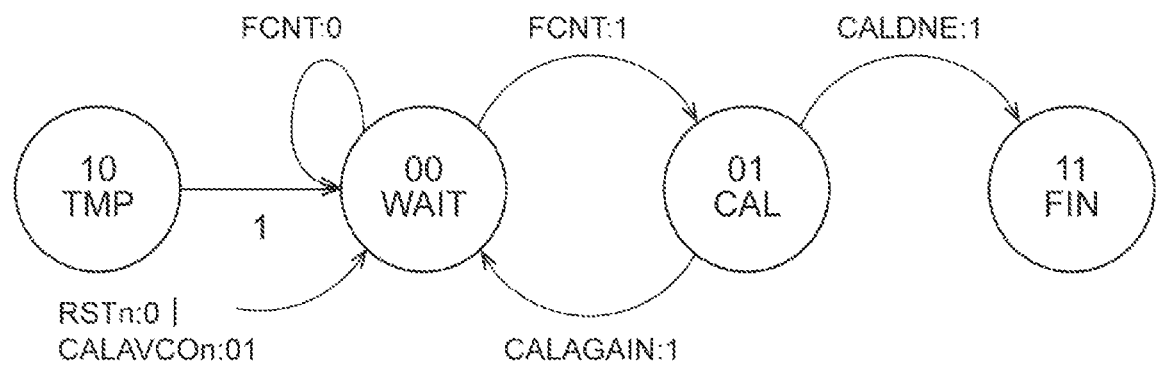
FIG. 9 is a diagram showing a state machine SCPCC.

FIG. 9 is a diagram showing the state machine SCPCC. FIG. 10 is a table showing output settings in each state in the state machine SCPCC. The state machine SCPCC has four states WAIT, CAL, FIN, and TMP. If a value of a variable FCNT is 0 in a WAIT state, the state remains in the WAIT state, the VCFIXp signal becomes a high level, the switch 72 of the setting unit 70 becomes in the ON state, and the control voltage value is set to the initial value V1.

If the value of the variable FCNT is 1 in the WAIT state, transition is made from the WAIT state to a CAL state, a PFDENp signal becomes a high level, a phase difference signal is output from the phase comparison unit 20, and the constant current Icp output from the charge pump 30 is supplied to the loop filter 40. If a value of a variable CALAGAIN is 1 in the CAL state, transition is made from the CAL state to the WAIT state. If a value of a variable CALDNE is 1 in the CAL state, transition is made from the CAL state to a FIN state. In the FIN state, both the VCFIXp signal and the PFDENp signal become low level, and normal operation is performed.

Figure 11:
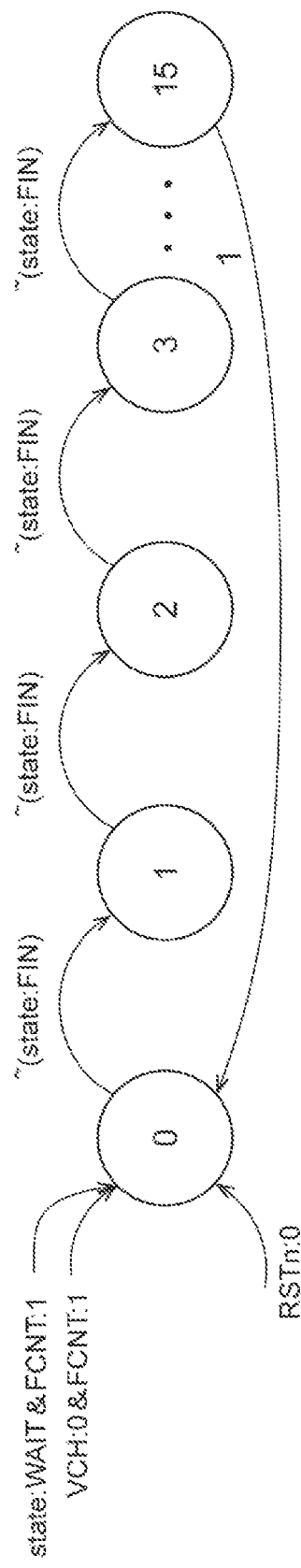
FIG. 11 is a diagram showing a state machine SCPCCNT.

FIG. 11 shows the state machine SCPCCNT. FIG. 12 is a table showing output settings in each state in the state machine SCPCCNT. The state machine SCPCCNT controls the counting operation of the counter in the WAIT state or CAL state. When a count value is not a fixed number M, a value of the FCNT variable becomes 0. When the count value reaches the fixed number M, the value of the FCNT variable becomes 1, and the state makes transition. Further, after the count value reaches the fixed number M, the count value is initialized to 0.

Figure 13:
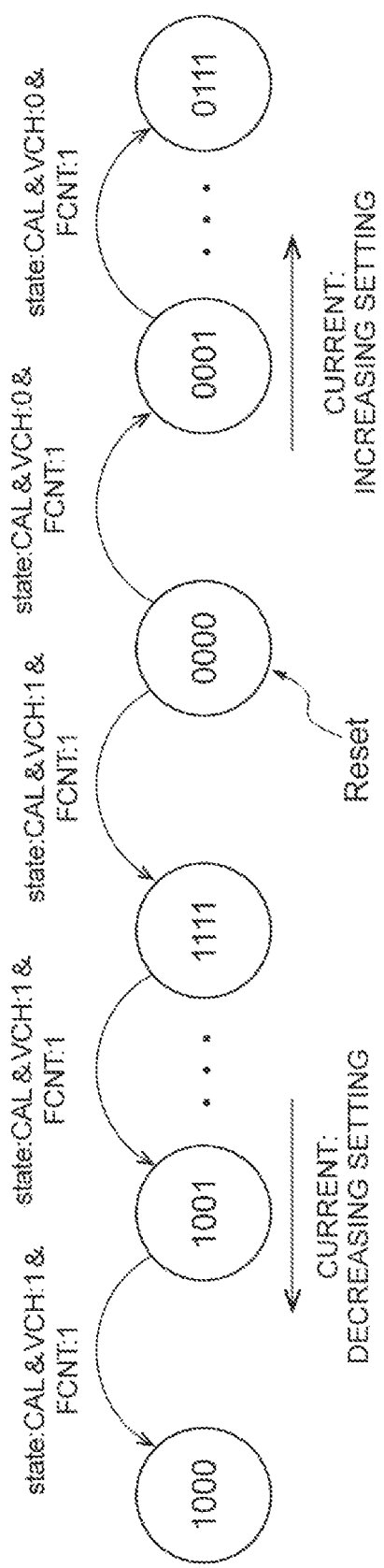
FIG. 13 is a diagram showing a state machine SCPCTL.

FIG. 13 is a diagram showing the state machine SCPCTL. The state machine SCPCTL controls current Icp output operation of the charge pump 30 based on a value of the VCH signal output from the detection unit 80 in the CAL state. That is, if the value of the VCH signal is 0, it is determined that the change rate of the control voltage value is low (that is, the current Icp is small), and the current Icp is increased. If the value of the VCH signal is 1, it is determined that the change rate of the control voltage value is high (that is, the current Icp is large), and the current Icp is decreased.

Figure 14:
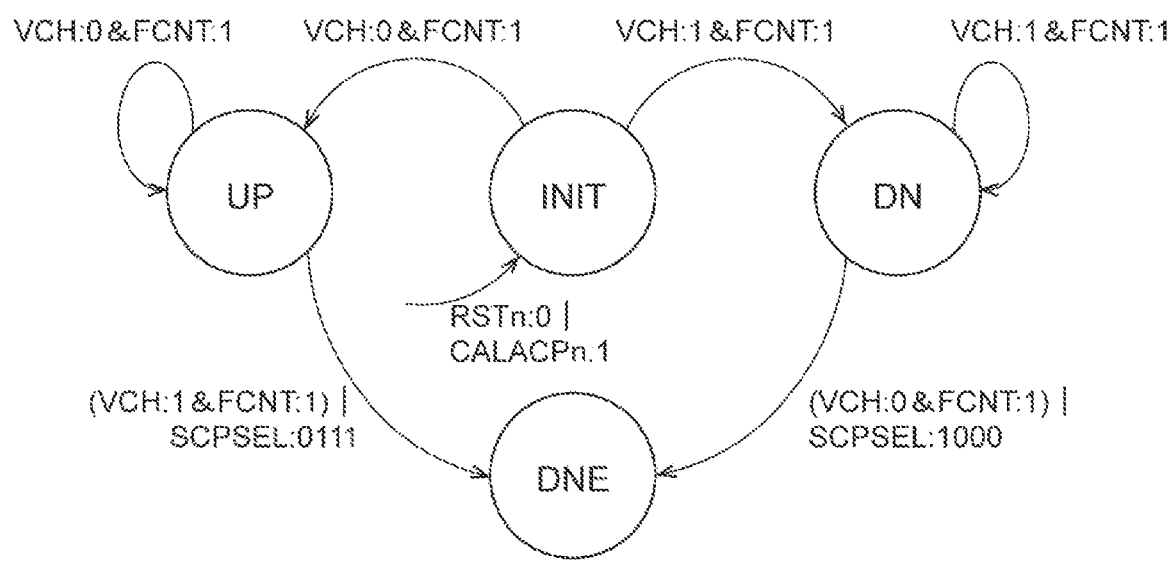
FIG. 14 is a diagram showing a state machine SCSG.

FIG. 14 is a diagram showing the state machine SCSG FIG. 15 is a table showing output setting in each state in the state machine SCSG. The state machine SCSG determines the end of the adjustment operation.

If the value of the VCH signal is 0 in an INIT state, a transition is made to an UP state, and the CALAGAIN signal becomes a high level. If the value of the VCH signal is 0 in the UP state, the state remains in the UP state and the CALAGAIN signal becomes a high level. If the value of the VCH signal is 1 in the UP state, a transition is made to a DNE state, and the CALDNE signal becomes a high level.

If the value of the VCH signal is 1 in the INIT state, a transition is made to a DN state, and the CALAGAIN signal becomes a high level. If the value of the VCH signal is 1 in the DN state, the state remains in the DN state and the CALAGAIN signal becomes a high level. If the value of the VCH signal is 0 in the DN state, a transition is made to the DNE state, and the CALDNE signal becomes a high level.

That is, in a case where the value of the VCH signal remains at 0 or in a case where the value of the VCH signal remains at 1, the adjustment is determined as insufficient, the CALAGAIN variable becomes a high level, transition is made from the CAL state to the WAIT, and the adjustment operation is repeated (FIG. 9).

On the other hand, in a case where the value of the VCH signal makes a transition from 0 to 1 or in a case where the value of the VCH signal makes a transition from 1 to 0, it is determined that the adjustment operation is finished, a transition is made to the DNE state, and the CALDNE signal becomes a high level. When the CALDNE signal becomes a high level, a transition is made from the CAL state to the FIN state, and normal operation is performed (FIG. 9).

REFERENCE SIGNS LIST

1 PLL frequency synthesizer
10 Reference oscillator
20 Phase comparison unit
30 Charge pump
30A First charge pump
30B Second charge pump
40 Loop filter
50 Voltage controlled oscillator
60 Frequency divider
70 Setting unit
80 Detection unit
90 Control unit

The invention claimed is:

1. A PLL frequency synthesizer comprising:
a voltage controlled oscillator configured to receive a control voltage value and output an oscillation signal having a frequency corresponding to the control voltage value;
a phase comparison unit configured to receive the oscillation signal output from the voltage controlled oscillator or a signal obtained by dividing the oscillation signal as a feedback oscillation signal, receive a reference oscillation signal, detect a phase difference between the feedback oscillation signal and the reference oscillation signal, and output a phase difference signal representing the phase difference;
a charge pump configured to receive the phase difference signal output from the phase comparison unit and output a charge and discharge current according to the phase difference represented by the phase difference signal;
a loop filter including a capacitive element that is charged and discharged by receiving the charge and discharge current output from the charge pump, and configured to output the control voltage value, which is increased or decreased according to a charge and discharge amount of the capacitive element, to the voltage controlled oscillator;
a detection unit configured to detect a change rate of the control voltage value when the charge and discharge current output from the charge pump is input to the loop filter; and
a control unit configured to adjust the charge and discharge current output from the charge pump, a characteristic of the loop filter, or a characteristic of the voltage controlled oscillator based on a detection result of the detection unit, wherein
said charge pump comprises a first charge pump and a second charge pump,
the loop filter includes a capacitive element connected to an output end of the first charge pump, an amplifier for outputting a voltage value according to a voltage value of the capacitive element, and a resistor having a first end connected to an output end of the amplifier and a second end connected to an output end of the second charge pump, and outputs the control voltage value from the second end to the voltage controlled oscillator, and
the control unit adjusts the charge and discharge current output from the first charge pump.

2. The PLL frequency synthesizer according to claim 1, wherein the detection unit detects the change rate of the control voltage value using the reference oscillation signal.

3. The PLL frequency synthesizer according to claim 1, further comprising a setting unit configured to set the control voltage value to a predetermined value, wherein the detection unit detects the change rate of the control voltage value from the predetermined value.

4. The PLL frequency synthesizer according to claim 3, wherein the setting unit includes an amplifier in a voltage follower configuration.

5. The PLL frequency synthesizer according to claim 3 wherein the loop filter includes a resistor having a first end for receiving the charge and discharge current output from the charge pump and a second end, and a capacitive element connected to the second end of the resistor, the setting unit sets a potential of the first end or the second end of the resistor to a predetermined value, and the detection unit monitors the potential of the first end or the second end of the resistor to detect the change rate of the control voltage value.

6. The PLL frequency synthesizer according to claim 1, wherein the charge pump includes a plurality of current sources provided in parallel, and the control unit adjusts the charge and discharge current output from the charge pump by changing the number of current sources to be used among the plurality of current sources of the charge pump.

7. The PLL frequency synthesizer according to claim 1, wherein the loop filter includes a resistor having a first end for receiving the charge and discharge current output from the charge pump and a second end, and a capacitive element connected to the second end of the resistor, and the detection unit monitors a potential of the first end or the second end of the resistor to detect the change rate of the control voltage value.

8. The PLL frequency synthesizer according to claim 1, wherein the loop filter includes a first capacitive element, a second capacitive element having a capacitance value larger than that of the first capacitive element, and a switch for connecting the first capacitive element and the second capacitive element in parallel with each other, the detection unit detects the change rate of the control voltage value and the control unit performs adjustment in a state where the second capacitive element is disconnected by the switch, and the second capacitive element is connected in parallel to the first capacitive element by the switch after adjustment by the control unit.

9. The PLL frequency synthesizer according to claim 1, wherein the voltage controlled oscillator is a voltage controlled oscillator of an LC-VCO type that includes a capacitive element having a capacitance value that changes depending on the control voltage value, and outputs the oscillation signal having a frequency according to the capacitance value of the capacitive element, and the control unit adjusts the characteristic of the voltage controlled oscillator by changing dependency of the capacitance value of the capacitive element on the control voltage value.

10. The PLL frequency synthesizer according to claim 1, wherein the voltage controlled oscillator is a voltage controlled oscillator of a Ring-VCO type that has a configuration in which a plurality of inverter circuits are connected in a ring shape, and outputs the oscillation signal having a frequency according to current supplied to the plurality of inverter circuits, and the control unit adjusts the characteristic of the voltage controlled oscillator by changing dependency of a current supply amount to the inverter circuits on the control voltage value.

* * * * *